(12) United States Patent
Mori

(10) Patent No.: US 6,803,991 B2
(45) Date of Patent: Oct. 12, 2004

(54) EXPOSURE AMOUNT CONTROL METHOD IN EXPOSURE APPARATUS

(75) Inventor: Kenichiro Mori, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/790,866

(22) Filed: Feb. 23, 2001

(65) Prior Publication Data
US 2001/0028448 A1 Oct. 11, 2001

(30) Foreign Application Priority Data
Feb. 24, 2000 (JP) ........................................ 2000/047359

(51) Int. Cl.⁷ .............................................. G03B 27/42
(52) U.S. Cl. .............................. 355/53; 355/68; 355/69
(58) Field of Search ............................. 355/43, 45, 53, 355/55, 67–69, 77; 430/311; 250/492.2

(56) References Cited

U.S. PATENT DOCUMENTS

| | | | | |
|---|---|---|---|---|
| 5,475,491 A | * | 12/1995 | Shiozawa | 355/68 |
| 5,617,181 A | * | 4/1997 | Yanagihara et al. | 355/53 |
| 5,815,248 A | | 9/1998 | Nishi et al. | 355/71 |
| 5,815,249 A | | 9/1998 | Nishi et al. | 355/71 |
| 5,892,573 A | * | 4/1999 | Takahashi et al. | 355/53 |
| 5,914,773 A | * | 6/1999 | Kurosawa et al. | 355/53 |
| 6,115,107 A | * | 9/2000 | Nishi | 355/53 |
| 6,256,087 B1 | | 7/2001 | Bader | 355/67 |
| 6,348,303 B1 | * | 2/2002 | Van Der Lei et al. | 355/53 |
| 2001/0035945 A1 | * | 11/2001 | Ozawa | 355/69 |
| 2001/0043321 A1 | * | 11/2001 | Nishi et al. | 355/67 |
| 2003/0025890 A1 | * | 2/2003 | Nishinaga | 355/53 |

FOREIGN PATENT DOCUMENTS

EP 0 950 924 A3 8/2001

* cited by examiner

Primary Examiner—D. Rutledge
(74) Attorney, Agent, or Firm—Fitzpatrick, Cella, Harper & Scinto

(57) ABSTRACT

An exposure amount control method includes steps of illuminating an original with exposure light, emitted from a light source, through one or more light intensity uniforming optical systems, so that a pattern of the original illuminated is projected and printed on a substrate, measuring, by use of a first illuminance sensor, and illuminance of the exposure light as branched at a light source of the or one of the light intensity uniforming optical systems which is closest to the original, controlling an exposure amount of the substrate on the basis of a measurement output of the first illuminance sensor, measuring, by use of a second illuminance sensor, an illuminance at a position substantially conjugate with the substrate, and calibrating an output of the first illuminance sensor on the basis of a measurement output of the second illuminance sensor.

44 Claims, 15 Drawing Sheets

EXPOSURE AMOUNT CONTROL METHOD IN EXPOSURE APPARATUS

FIELD OF THE INVENTION AND RELATED ART

This invention relates to an exposure amount control method, a device manufacturing method, and/or an exposure apparatus, suitably applicable to a projection exposure apparatus, for example, to be used in a lithographic process for the manufacture of semiconductor devices, liquid display devices, image pickup devices (e.g., CCDs), or thin film magnetic heads, for example. The present invention is particularly suitably applicable to a scanning exposure type projection exposure apparatus of a step-and-scan method wherein a mask and a substrate are scanningly moved in synchronism with each other and relative to a projection optical system while a portion of the mask pattern is being projected onto the substrate, by which the mask pattern is sequentially transferred to shot regions on the substrate.

FIG. 1 shows a conventional scan type projection exposure apparatus having an illumination unit for uniformly illuminating a pattern by use of light from an exposure light source, and a projection optical system for projecting the thus illuminated pattern onto a substrate. While the following description will be made on an example wherein a divergent light source such as a Hg lamp, for example, is used, the same applies to an example wherein a light source has a directionality such as a laser, for example. Denoted in FIG. 1 at 1 is a light source, and denoted at 2 is a condensing mirror for collecting light emitted from the light source 1. The light divergently emitted from the light source 1 is collected by the mirror 2, and the light then passes through an optical system 3. Then, it goes through a light attenuating unit 18 and enters an internal reflection member 4.

The internal reflection member 4 has a structure that the light incident thereon is reflected plural times at the side face thereof, whereby the light intensity distribution being non-uniform at the light entrance surface is made uniform at the light exit surface thereof. The internal reflection member 4 may be mirrors disposed opposed to each other, or it may be simply a rod-like glass material. In the latter case, it should be designed so that, when the light impinges on the side face of the rod-like glass material, the light is totally reflected due to the difference in refractive index between the glass material and the air, and that the side face should be polished.

Denoted at 5 is an optical system for projecting a uniform intensity distribution, produced at the light exit surface of the internal reflection member 4, onto a light entrance surface of a fly's eye lens 6. The fly's eye lens 6 comprises a bundle of rod lenses each having a light entrance surface and a light exit surface being mutually placed at their focal points. Light rays incident on the rod lenses at the same angle are collected at the light exit surfaces of the rod lenses, such that, in total, a number of light convergence points are defined at the light exit surface of the fly's eye lens 6.

Denoted at 7 is an optical system for uniformly illuminating an illumination region by using, as secondary light sources, the light convergence points produced at the light exit surface of the fly's eye lens 6. In projection exposure apparatuses, it is necessary to control the illumination region and, for this reason, the illumination region is not directly illuminated but a uniform light intensity distribution is provided once at a position optically conjugate with the mask surface. Denoted at 8 is a stop for controlling the illumination region, and the position thereof is placed optically conjugate with the mask surface. A uniform light intensity distribution produced there is projected by a relay optical system 9 to illuminate a mask 10 (illumination region).

The stop 8 for controlling the illumination region is made movable, and it can be moved in accordance with the illumination region on the mask 10. Only a set of stop components is illustrated in the drawing, but actually it comprises at least two sets of stop components. One set of them is used to restrict the exposure region on a substrate, and it moves in synchronism with the substrate at the start and the end of the exposure region. Another set is used to control the illumination region of the illumination light, and it is held fixed during the exposure. This stop is driven so as to change the width of the illumination region in the scan direction to control the exposure amount, or to change the width at each position so as to remove exposure non-uniformness in the direction perpendicular to the scan direction.

Denoted at 11 is a projection optical system for imaging a pattern, formed on the mask 10, onto a substrate 12. It serves to print the pattern of the mask 10, as illuminated with uniform illumination light provided by the above-described illumination system, on a photosensitive material applied to the substrate 12 thereby to transfer the mask pattern to the substrate. The projection optical system 11 is a telecentric system such that, even with a shift of the mask 10 position or substrate 12 position in the optical axis direction, the projection magnification is unchanged. The exposure apparatus is a scan type projection exposure apparatus and, thus, the mask 10 and the substrate 12 are scanningly moved in synchronism with each other. Also, because the mask 10 moves, the illumination region changes accordingly and, therefore, the stop 8 for controlling the illumination region is also made movable.

Denoted at 13 is a movable stage on which an illuminance sensor 14 is mounted. This stage is arranged to provide scan motion for scan exposure of the substrate 12, and stepwise motion for exposures of plural shots on the substrate. Further, it is operable to move the illuminance sensor 14 to the same position where the substrate 12 is present during the exposure process, to ensure that the sensor measures the illuminance at the same position as the substrate.

In projection exposure apparatuses for use in the manufacture of semiconductor devices, for satisfactory transfer of the pattern of the mask 10 onto the substrate 12, it is necessary to expose the substrate 12 with a proper exposure amount which is dependent upon the photosensitive material applied to the substrate 12 and the pattern of the mask 10. For example, when a positive pattern and a negative resist are used, an exposure with an amount less than a proper exposure amount causes insufficient printing, which leads to thinning of pattern lines or disconnection of the lines. On the other hand, an exposure amount with an amount larger than the proper exposure amount causes excessive printing, which leads to thickening of pattern lines or connection of adjacent lines. When a negative pattern and a positive resist are used, an exposure with an amount less than a proper exposure amount causes insufficient exposure, which leads to thickening of pattern lines or connection of adjacent lines. On the other hand, an exposure with an amount larger than the proper exposure amount causes excessive printing, which leads to thinning pattern lines or disconnection of lines. Anyway, an exposure with an improper exposure amount results in failure of formation of an adequate pattern on the substrate, which directly leads to a decrease of the yield.

The exposure amount in such a scan type projection exposure apparatus is "s×I/v" where s is the length of the illumination region in the scan direction, I is the illuminance on the substrate 12, and v is the scan speed. Thus, for the control of the exposure amount in the scan type projection exposure apparatus, at least one of the length s of the illumination region in the scan direction, the illuminance I on the substrate, and the scan speed v should be controlled. The length s of the illumination region in the scan direction can be changed by moving the stop 8 for controlling the illumination region. The scan speed v can be changed by changing the scan speeds of the substrate 12, the mask 10 and the stop 8 for controlling the illumination region.

The light attenuating unit 18 is disposed on the light path, and the transmission factor thereof is made variable. It controls the illuminance I on the substrate 12 to provide a predetermined illuminance thereon. As for such light attenuating means having a variable transmission factor, an example may be one which includes plural optical members having different transmission factors which may be placed upon a turret and, by selecting these members, the transmission factor may be changed. Another example may be a unit in which a mirror whose reflection factor is variable in dependence upon the angle with the light and in which the angle of the mirror is changed to change the transmission factor. In practical projection exposure apparatuses, the output of the light source 1 involves flicker and, thus, without constant illuminance control based on illuminance measurement during the exposure operation, the exposure amount within the exposure region on the substrate becomes non-uniform and, therefore, non-uniform exposure results.

Constant illuminance control should be done to avoid such exposure nonuniformness. However, it is not attainable to perform the constant illuminance control by directly measuring the illuminance on the substrate 12 during the period for transferring the mask 10 pattern onto the substrate. Further, if the illuminance is measured at the light path of exposure light, a shadow of an illuminance sensor will be formed on the substrate 12. This adversely influences the transfer of the mask 10 pattern to the substrate 12. In consideration of it, generally, the illuminance is measured at a position which is conjugate with the substrate 12 and which is branched from the light path of the exposure light, and the exposure amount control is made on the basis of it.

Denoted at 15 is a half mirror having a very low reflection factor, which is inserted into the light path so as to define a position branched off the light path of the exposure light and being conjugate with the substrate 12. The half mirror 15 is disposed obliquely to the optical axis of the exposure light, and it functions to divide the exposure light and to define a position, where an illuminance sensor 16 for measuring the illuminance is present, which position is branched off the exposure light and is conjugate with the substrate 12. Measuring the illuminance at a position conjugate with the substrate 12 is to assure one-to-one correspondence with the illuminance on the substrate 12 regardless of variation with time of the light emission center of the light source 1, such as fluctuation, for example.

For exposure of the substrate 12 with a proper exposure amount, before the exposure of the substrate 12, the illuminance sensor 14 mounted on the stage 13 is moved to the illumination region for calibration thereof. The calibration is performed by executing a dummy exposure and then comparing outputs of the illuminance sensors 14 and 16. For exposure of the substrate 12, the control unit 17 operates on the basis of the output of the illuminance sensor 16 to perform the constant illuminance control.

Denoted at 19 is a shutter for opening and closing the light path of exposure light. In projection exposure apparatuses of simultaneous exposure type, the shutter is closed at the moment when the exposure amount on the substrate reaches the proper exposure amount, and the exposure amount is so controlled. In scan type projection exposure apparatuses, on the other hand, the exposure cannot be completed until the scan is completed. Thus, the exposure amount cannot be controlled on the basis of shutter opening and closure. In the scan type projection exposure apparatus, the shutter 19 is used to block the illumination light, during the stepwise motion between adjacent shots or a period in which no exposure process is performed, to thereby prevent degradation of the illumination system.

When a half mirror is used in the optical system, as the angle defined between the light and a normal to the half mirror increases, the difference in reflection factor depending on the state of polarization of the light becomes large. If, therefore, the angle between the optical axis and a normal to the half mirror 15 in FIG. 1 is large, the light intensity after the half mirror 15 is different in dependence upon the state of polarization. This results in non-uniform illuminance upon the illumination region. Further, if the state of polarization of the light source 1 changes with time, it causes variation in the ratio between the quantity of light impinging on the illuminance sensor and the quantity of light impinging on the substrate 12. As a result, the exposure amount control precision is degraded. Thus, in order that uniform illumination is performed in the illumination region and good exposure amount control is performed, the half mirror 15 should be disposed with an angle close to a right angle, as much as possible. Simultaneously, it should be assured that the light reflected by the half mirror 15 reaches the illuminance sensor 16 without being eclipsed. However, if the half mirror 15 is disposed on the light path while satisfying these two conditions, the spacing between the half mirror 15 and a lens just before the half mirror 15 must be kept large. This means that a large space should be prepared for the exposure amount control on the substrate 12.

On the other hand, for performance improvements as recently required for projection exposure apparatuses, an optical system of the projection exposure apparatuses is very complicated and the size thereof is increasing. In consideration of this, for reduction in size of the projection optical system, the space necessary for the exposure amount control should desirably be reduced. However, reducing this space will lead to non-uniform illuminance or degradation of the exposure amount control precision, as described hereinbefore.

SUMMARY OF THE INVENTION

It is accordingly an object of the present invention to provide an exposure amount control method, a device manufacturing method and/or an exposure apparatus, by which the space necessary for the exposure amount control can be reduced without non-uniform illuminance or degradation of the exposure amount control precision.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
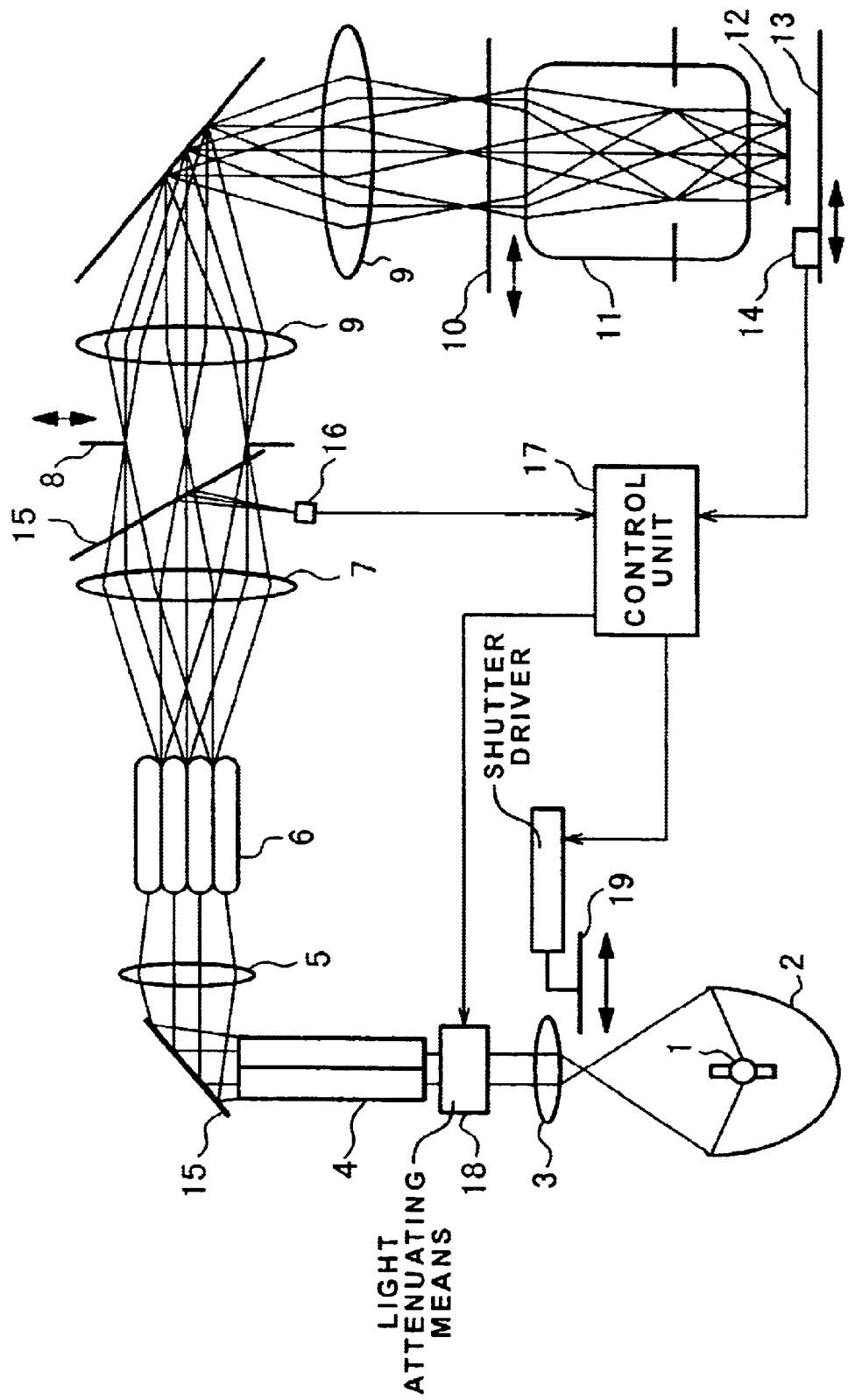
FIG. 1 is a schematic view of an exposure apparatus of a known type.

A light intensity uniforming optical system is an optical system by which a nonuniform light intensity is made uniform, at a predetermined position and in a predetermined range. For example, the internal reflection member 4 shown in FIG. 1 is such a light intensity uniforming member (optical system) by which a non-uniform light intensity distribution at the light entrance surface is made uniform at the light exit surface, in the aperture of the internal reflection member 4. Also, the optical system including the fly's eye lens 6 and the optical system 7 whose pupil plane is placed at the light exit surface of the fly's eye lens, is a light intensity uniforming optical system by which a non-uniform light intensity distribution at the light entrance surface of the fly's eye lens 6 is made uniform, upon the image plane of an optical system whose pupil plane is placed at the light exit surface of the fly's eye lens 6, and within an illuminance range as determined by the light emission angle of the fly's eye lens 6 and the focal length of the optical system 7.

Conventionally, the exposure amount control is performed on the basis of an output of an illuminance sensor which is disposed at the substrate side of a light intensity uniforming optical system, being closest to the substrate, and which is placed at a position substantially optically conjugate with the substrate and branched off the illumination light. In some preferred embodiments of the present invention to be described below, as compared therewith, the exposure amount control may be performed on the basis of an output of first illuminance measuring means which is on the light source side of a light intensity uniforming optical system closest to the substrate. More specifically, at the light source side of the light intensity uniforming optical system closest to the substrate, a half mirror may be inserted, for example, to branch the exposure light toward the first illuminance measuring means. With this structure, even if there occurs a difference in light intensity in dependence upon the state of polarization of light after the half mirror, which is attributable to the angle defined between the half mirror and the optical axis, it does not cause non-uniform illuminance because the difference is made uniform by the light intensity uniforming optical system. Therefore, it is unnecessary to be careful with the angle between the half mirror and the optical axis. The space required for the half mirror is therefore made small.

Here, it should be noted that, since the first illuminance measuring means measures the illuminance prior to being made uniform by the light intensity uniforming optical system, the non-uniformness of illuminance at the measurement position may change due to a change, with time, of the light emitting portion of the light source such as positional deviation, for example, and the measured illuminance may change while being influenced by it. On the other hand, as regards the illuminance on the substrate, since any change in illuminance non-uniformness with a change in time, as described above, is reduced by means of the light intensity uniforming optical system, there is substantially no change in illuminance with respect to time. For these reasons, there is a possibility that the interrelation between the illuminance on the substrate and the output of the first illuminance measuring means changes with the elapse of time. This means a possibility that, even if the illuminance on the substrate and the output of the first illuminance measuring means is correlated at a certain timing, the relation may change with the elapse of time. Namely, even if the first illuminance measuring means continuously produces the same output, there is a possibility that, while a desired illuminance is produced on the substrate at an initial stage and the exposure is performed with an optimum exposure amount, the illuminance on the substrate decreases with the elapse of time and insufficient exposure amount results, or alternatively, the illuminance on the substrate increases to cause excessive exposure. The product yield decreases anyway.

Further, since the substrate and the first illuminance measuring means are not placed in an optically conjugate relation, there is a possibility that the relation between the illuminances thereupon change with the illumination condition. Here, the illumination condition may refer to a coherence factor of the exposure apparatus, or the shape of an effective light source in modified illumination such as ring zone illumination, for example. In order to change the shape of the effective light source, there are cases in which a stop for eclipsing the light is provided between the substrate and the location where the first illuminance measuring means is placed. For these reasons, the relation between the illuminance on the substrate and the illuminance of the first illuminance measuring means may change if the illumination condition changes.

In consideration of it, second illuminance measuring means may be disposed at a position conjugate with the substrate, and outputs of the first and second illuminance measuring means may be correlated in short time intervals. As a result, even if the exposure amount control on the substrate is performed on the basis of the output of the first illuminance measuring means, the substrate can be exposed with an optimum exposure amount. On that occasion, since the second illuminance measuring means is required only to measure the illuminance during a non-exposure period of the substrate, it is unnecessary to use a half mirror to branch the light to be incident on the second illuminance measuring means. Since no half mirror is used, the output of the second illuminance measuring means is kept out of being influenced by the state of polarization of the light source.

The outputs of the first and second illuminance measuring means should be correlated with each other in short time intervals, to avoid a decrease of the throughput. Also, the second illuminance measuring means placed at a position conjugate with the substrate should not be influential to the exposure. To this end, when it is correlated with the output of the first illuminance measuring means, the second illuminance measuring means may be inserted into the light path or, alternatively, a reflection mirror may be inserted into the light path so that the exposure light impinges on the second illuminance measuring means.

For insertion of the second illuminance measuring means into the light path, a specific inserting mechanism may be provided. However, in the scan type projection exposure apparatus, a movable stop is disposed at a position conjugate with the substrate, for blocking a portion of or the whole of the illumination light during a period in which an original and the substrate are synchronized with each other prior to the start of scan exposure and during a period in which the whole illumination region comes into the exposure region so as to control the illumination region in registration with the exposure region. In consideration of it, a second illuminance sensor may be mounted on this movable stop, such that the second illuminance sensor can be inserted into the light path without an additional loss of time.

Even if there occurs a change, with time, in the optical system following the second illuminance sensor, by performing calibration of the second illuminance measuring means at certain intervals T2, constant illuminance control can be made so that a desired illuminance is provided on the substrate.

Figure 2:
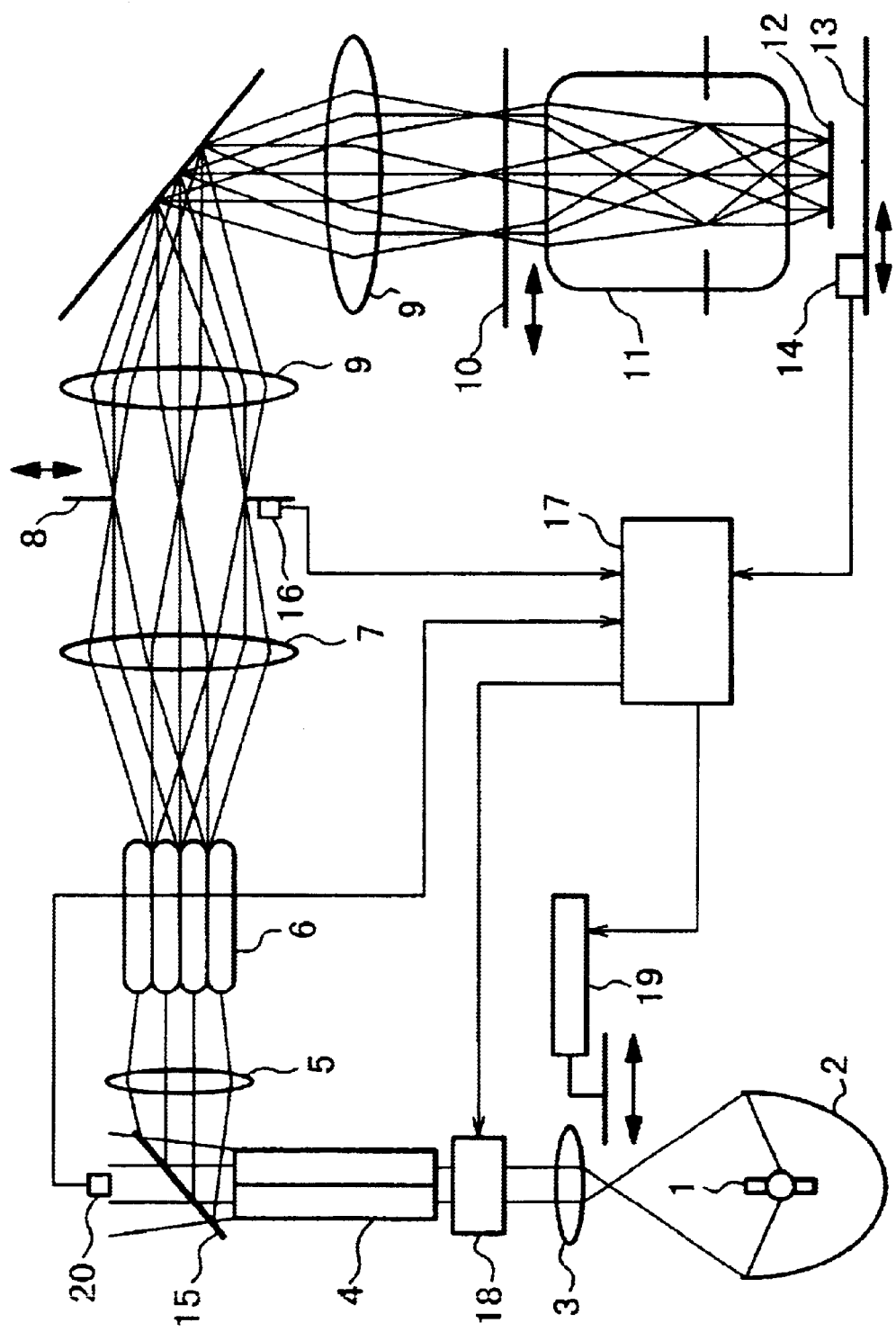
FIG. 2 is a schematic view of an exposure apparatus according to a first embodiment of the present invention.

FIG. 2 shows an exposure apparatus according to a first embodiment of the present invention. This exposure apparatus differs from the conventional structure of FIG. 1 in that: there is a half mirror 15 disposed at the light source side of a fly's eye lens 6 which is light intensity uniforming means close to the surface to be illuminated; that there is a first illuminance sensor 20 disposed on a light path branched by the half mirror 15; and that there is a second illuminance sensor 16 disposed on a variable stop 8. The illuminance sensor 16 may preferably be disposed on a stop element, of the variable stop 8, which controls the exposure region. The illuminance sensor 14 disposed on the stage 13 corresponds to the third illuminance sensor of the present invention.

Figure 5:
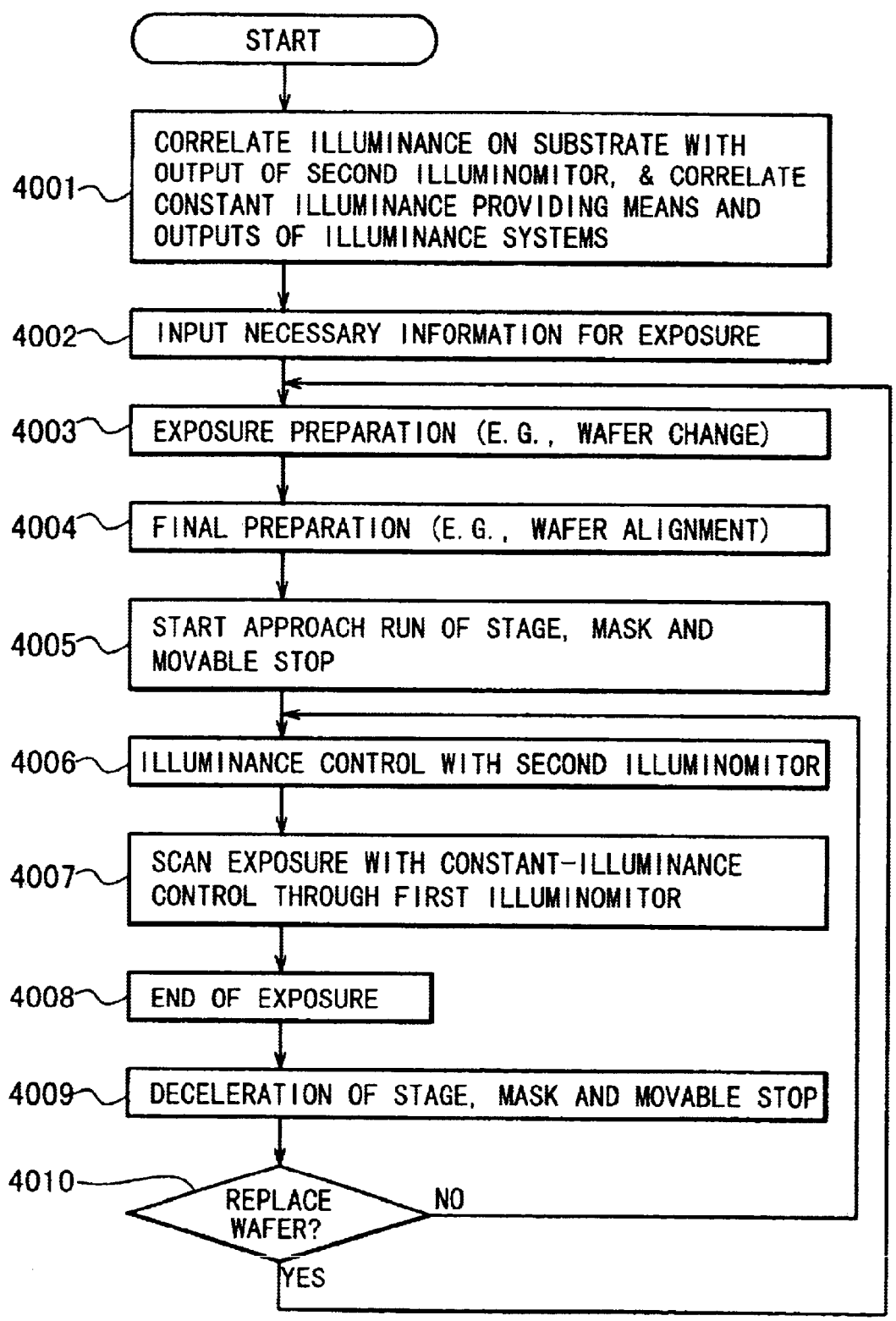
FIG. 5 is a flow chart for explaining the exposure amount control operation in the exposure apparatus of FIG. 2 or 3.

FIG. 5 is a flow chart for explaining the exposure amount control operation for providing a proper exposure amount on the substrate 12. As the control operation starts, first, at step 4001, the illuminance on the substrate 12 and the output of the second illuminance sensor 16 are correlated. For the correlation, for example, the illuminance sensor 14 on the stage 13 may be moved into the illumination region, and the variable stop 8 may be moved to such a position where light impinges on both the illuminance sensor 16 on the variable stop 8 and the illuminance sensor 14 on the stage 13 simultaneously. Then, a dummy exposure may be performed, and the illuminance on the substrate 12 as measured by the sensor 14 and the output of the sensor 16 may be correlated. Alternatively, the illuminance sensor 14 of the stage 13 may be moved into the illumination region, and the variable stop 8 may be moved to move the illuminance sensor 16 out of the light path, such that light may be projected to them alternately and the outputs of them may be compared with each other. Further, the relation between each sensor and constant-illuminance providing means may be detected. Here, the constant-illuminance providing means refers to one controlled to provide a constant illuminance, and it functions to control the power of the light source, the position of the light source, or the transmission factor of an ND filter, for example. When the electric power of the light source is controlled to provide constant illuminance control, the electric power may be changed and the output of the illuminance sensor at that time is measured.

Next, at step 4002, information necessary for exposure such as proper exposure amount, for example, is inputted. Then, at step 4003, loading or unloading of a wafer 12 onto or from the wafer stage 13, or replacement of a reticle 10 as required is performed. Also, the transmission factor of the light attenuating means 18 may be set so as to provide an illuminance effective to produce a proper exposure amount. Further, at step 4004, final preparation such as alignment or leveling of the wafer 12, for example, is performed.

Subsequently, at step 4005, approach running of the variable stop 8, mask 10 and stage 13 is initiated, for the scan exposure. At step 4006, illuminance control is made so that the illuminance on the substrate 12 reaches a desired illuminance, on the basis of an output of the illuminance sensor 16 mounted on the variable stop 8. The output of the illuminance sensor 20 at that time is memorized into storing means.

As the approach running region is passed and the approach running is completed, at step 4007, the exposure process starts. During the exposure operation, constant-illuminance control is made so that the output of the illuminance sensor 20 is held at the output as memorized at step 4006. As regards the constant illuminance control, the electric power to be applied to the light source 1 may be controlled, for example. Any other method is usable.

When the exposure is completed at step 4008, then, at step 4009, the variable stop 8, the mask 10 and the stage 13 are decelerated. Then, at step 4010, whether the wafer should be replaced or not is discriminated. Namely, if the exposure of the wafer 12 currently placed on the wafer stage 13 is completed, the sequence goes back to step 4003, and the wafer 12 is replaced by another. If the exposure of the current wafer 12 is not completed, the sequence goes back to step 4005, and exposure of the next shot is performed.

Figure 6:
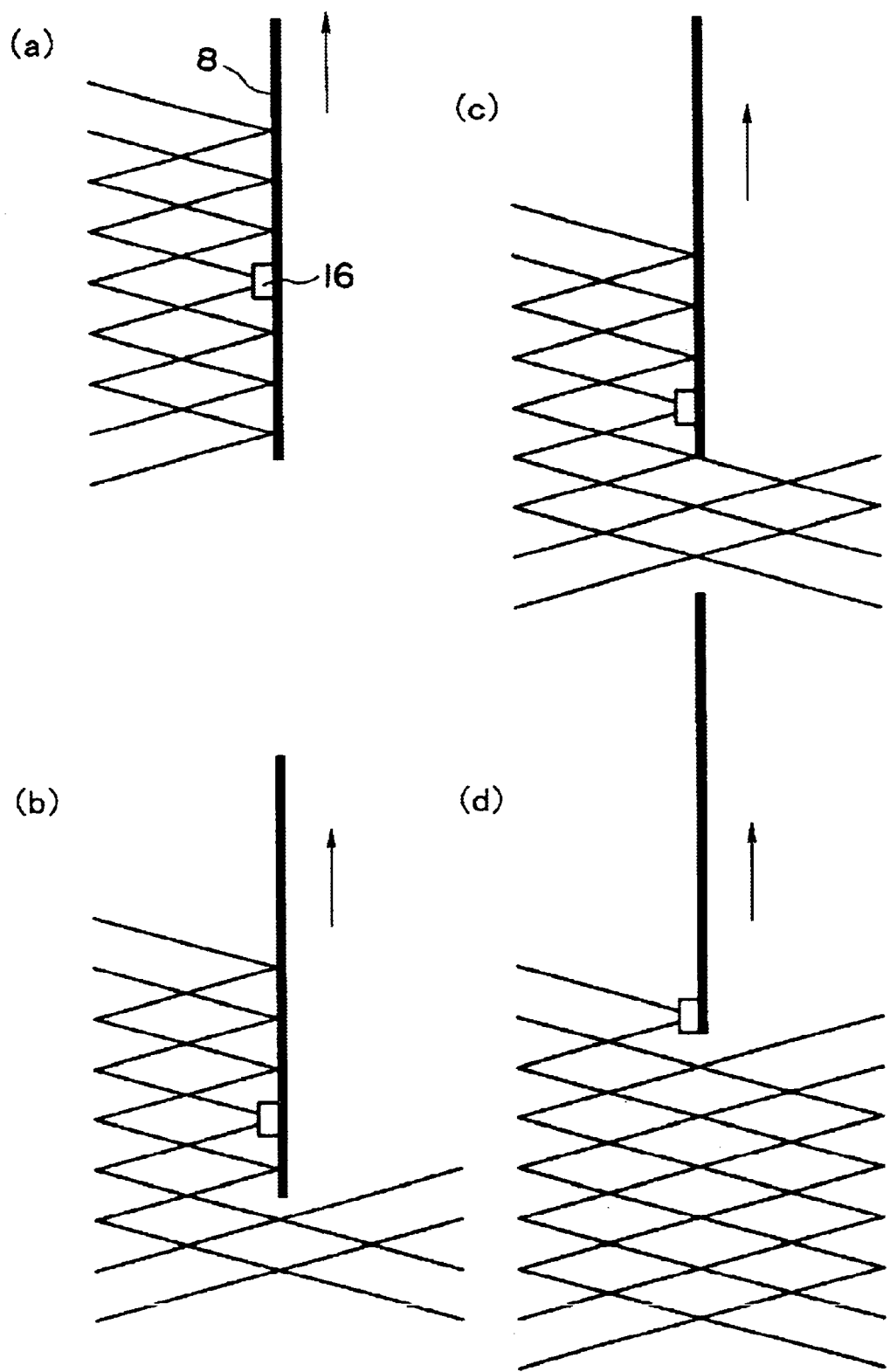
FIG. 6 is a schematic view for explaining measurement of an illuminance at a predetermined position, using a movable illuminance sensor and during motion of a movable stop, in the exposure apparatus of FIG. 2.

The illuminance sensor 16 on the variable stop 8 may be made movable upon the stop 8, or alternatively, it may comprise plural illuminance sensors. For example, if it is movable on the stop 8, as shown in FIG. 6, it can operate to measure the illuminance at a predetermined position even when the variable stop 8 is moving. FIG. 6 at (a)–(d) schematically shows the motion of the second illuminomitor 16 during the period in which the variable stop 8 moves. In FIG. 6 at (a), (b) and (c), the second illuminomitor 16 continuously measures the illuminance at a single point. This is because of the following reason. That is, in a projection exposure apparatus, uniform illuminance is provided within the illumination region. However, there are cases wherein a small illuminance non-uniformness is present therein. Particularly, in scan type projection exposure apparatuses, even if there is illuminance non-uniformness with respect to the scan direction, it can be averaged by the scan. As a result, it does not produce exposure non-uniformness in the exposure region and, therefore, a small illuminance non-uniformness is tolerable. On that occasion, if the illuminance sensor 16 moves together with the variable stop 8, the output of the illuminance sensor 16 varies. As a result, it becomes difficult to perform the illuminance control, at step 4006, on the basis of the output of the sensor 16, so as to produce a desired illuminance on the substrate 12. As compared therewith, if the illuminance sensor 16 on the variable stop 8 is made movable, the illuminance at a predetermined position in the illumination region can be measured even though the variable stop 8 moves. Thus, regardless of illuminance non-uniformness in the illumination region, the illuminance control can be done and, therefore, the exposure with a proper exposure amount can be performed easily.

Figure 7:
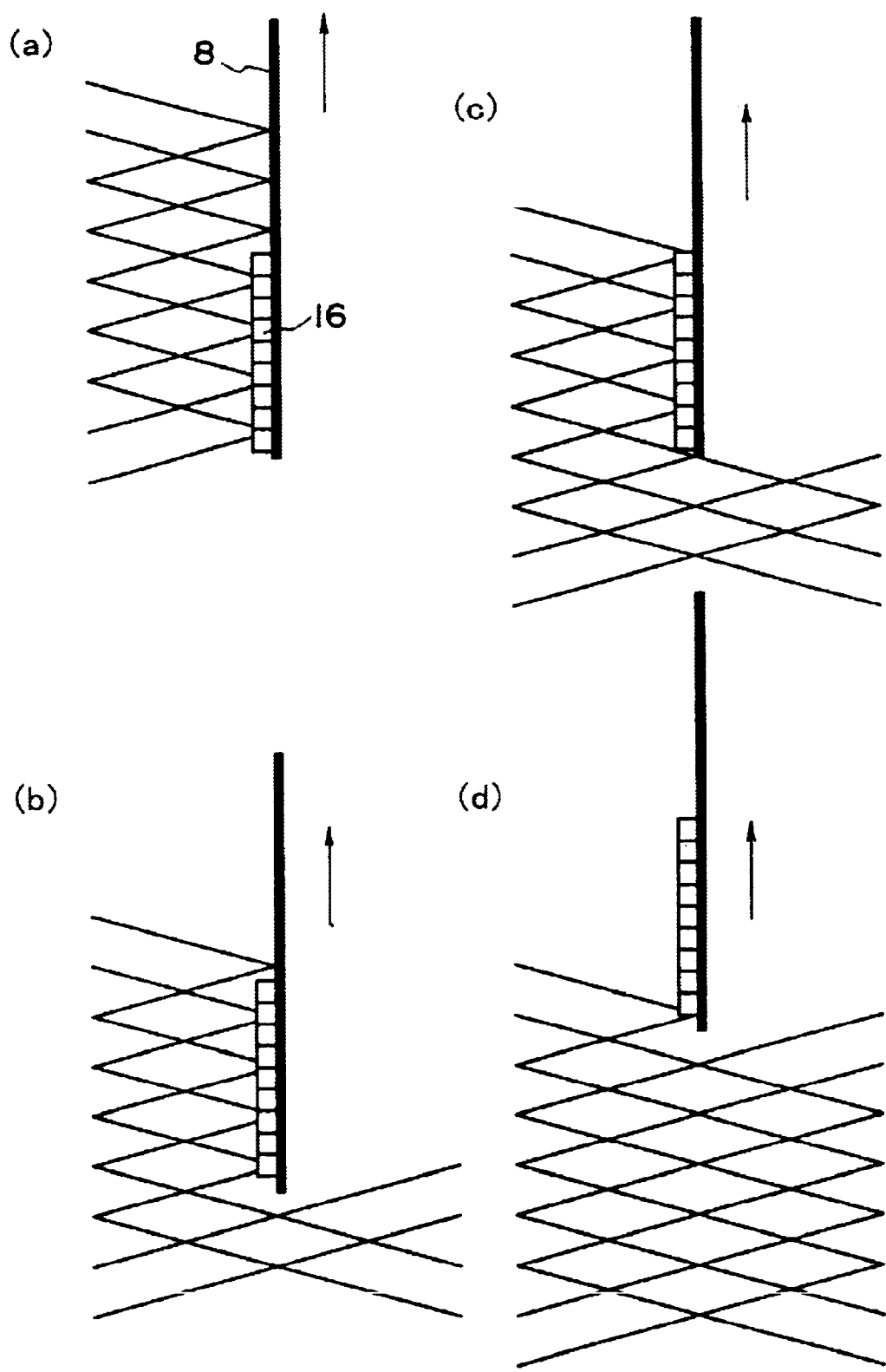
FIG. 7 is a schematic view for explaining measurement of an illuminance, using a line sensor and during motion of a movable stop, in the exposure apparatus of FIG. 2.

The illuminance sensor 16 may not be movable. Namely, a line sensor 17 may be provided as the illuminance sensor 16, as shown in FIG. 7, and disposed along the scan direction. In synchronism with the scan speed of the variable stop 8, illumination sensors of the line sensor from which values are to be extracted may be interchanged. Substantially the same effect as that of the movable illuminance sensor of FIG. 6 is attainable, with this structure. Further, a plurality of illuminance sensors may be disposed in a direction perpendicular to the scan direction. This is effective to reduce the exposure non-uniformness in the whole exposure region.

In this embodiment, the constant illuminance control is performed without integrated exposure amount control. This provides the following advantageous effects.

The relation between the illuminance as obtained at the light path branched before the illuminance uniforming optical system and the illuminance at the substrate position as illuminated through the illuminance uniforming optical system, is not always linear because the exposure region and the sensor position are not in an approximately conjugate relation. The relation may be complex as being represented by a second order or higher. In such a case, even if the integrated exposure amount of pulse lights having a possibility of variation is predicted proportionally on the basis of the integrated value of illuminance measured values on the branched light path, the integrated value may not correspond to the integrated exposure amount on the substrate.

However, even if the relation is not linear, since an increase in one is necessarily accompanied by an increase of the other, a particular illuminance measured value on the branched light path still has a one-to-one correspondence to an actual particular illuminance value on the substrate. In consideration of it, the present embodiment uses this relation and performs the light source control so that a constant illuminance value corresponding to a predetermined illuminance on the substrate can be detected continuously, on the branched light path. As a result of this, while the structure is such that the illuminance is detected on the light path branched before the illuminance uniforming means, accurate exposure amount control is accomplished as a consequence.

Figure 3:
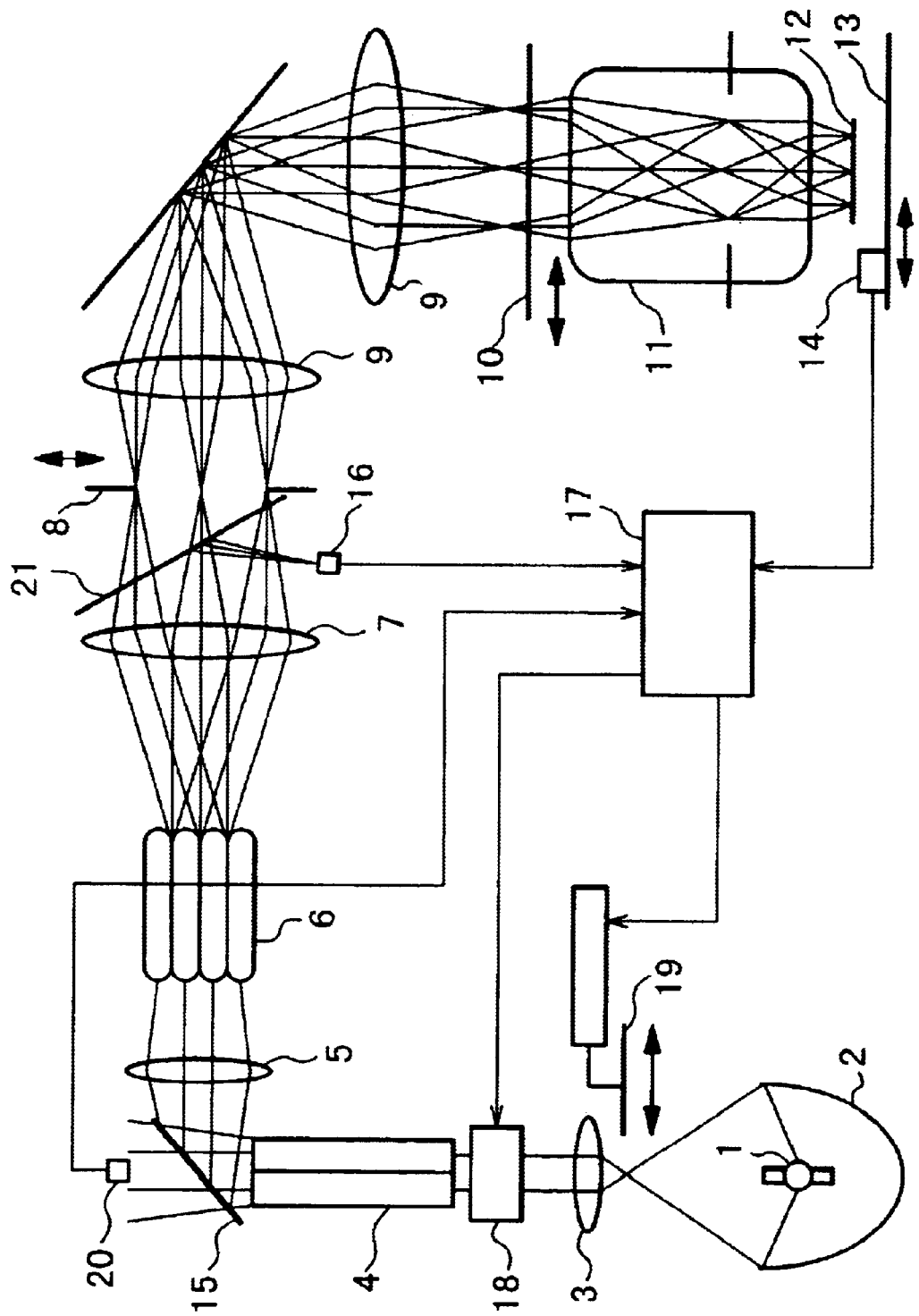
FIG. 3 is a schematic view of an exposure apparatus according to a second embodiment of the present invention.
Figure 4:
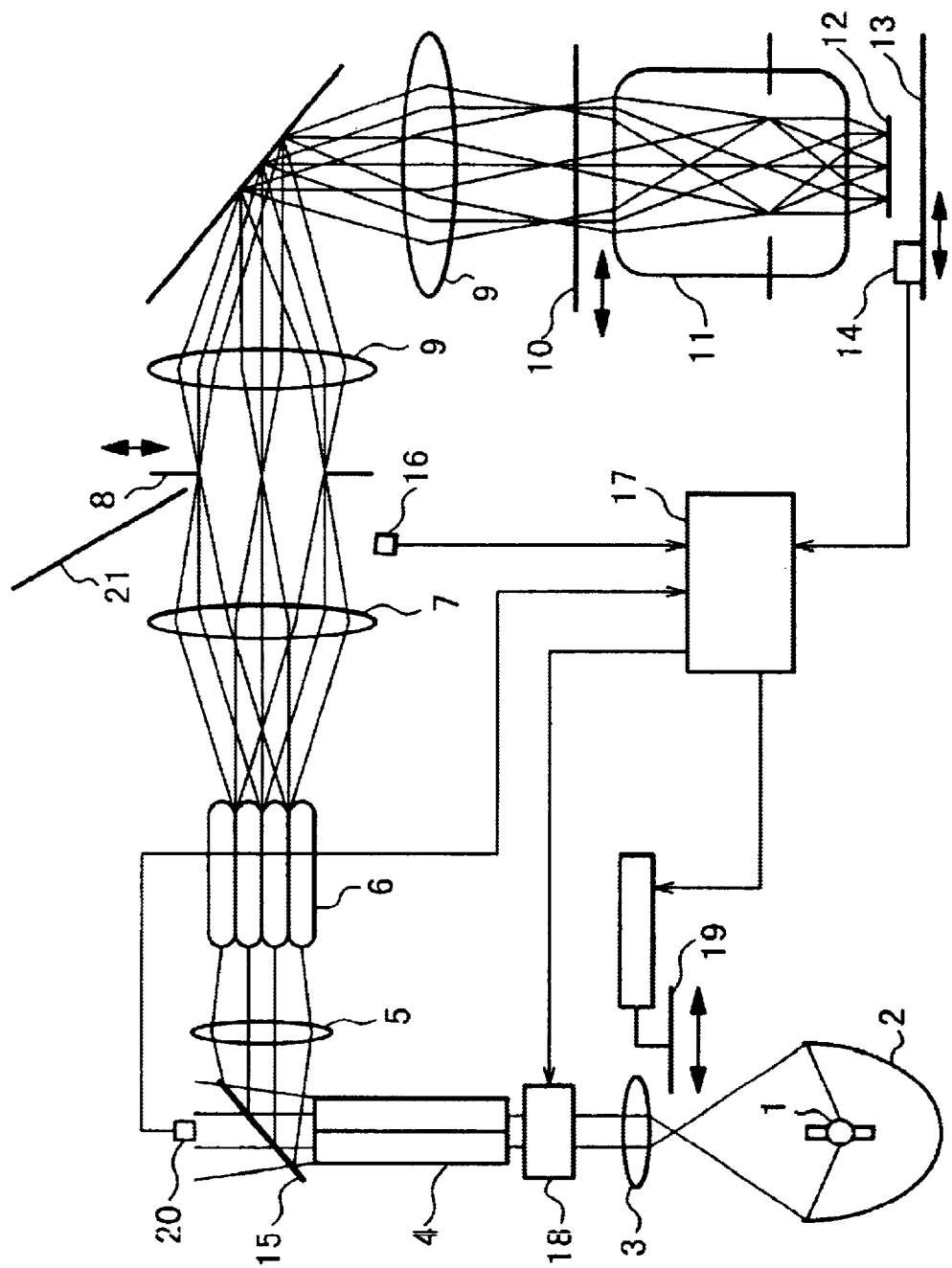
FIG. 4 is similar to FIG. 3 and illustrates a state, in the exposure apparatus of FIG. 3, in which a reflection mirror is extracted out of the light path.

FIGS. 3 and 4 show an exposure apparatus according to a second embodiment of the present invention. This embodiment differs from the second embodiment in that the second illuminance sensor 16 is disposed on the light path as defined by inserting a demountable reflection mirror 21 into the light path, rather than placing it on the variable stop 8. The reflection mirror 21 may be a total reflection mirror, or it may be a half mirror. FIG. 3 shows a state in which the reflection mirror 21 is inserted into the light path. FIG. 4 shows a state in which the mirror 21 is extracted out of the light path.

Referring to the flow chart of FIG. 5, the exposure amount control operation for attaining a proper exposure amount on the substrate 12 with the structure described above, will be explained. As the control operation starts, first, at step 4001, the illuminance on the substrate 12 and the output of the second illuminance sensor 16 are correlated. For the correlation, for example, if the reflection mirror 21 is a half mirror, the illuminance sensor 14 on the stage 13 may be moved into the illumination region so that light can impinge both the illuminance sensor 16 and the illuminance sensor 14 on the stage simultaneously. Then, a dummy exposure may be performed, and the illuminance on the substrate 12 as measured by the sensor 14 and as divided by the transmission factor of the half mirror and the output of the sensor 16 may be correlated. Alternatively, if the mirror 21 is a total reflection mirror, the illuminance sensor 14 of the stage 13 may be moved into the illumination region, and the reflection mirror 21 may be mounted/demounted so that the light impinges on these sensors alternately. Then, the outputs of them may be compared with each other. Further, like the first embodiment, the relation between each sensor and constant-illuminance providing means may be detected beforehand.

Next, at step 4002, information necessary for exposure such as proper exposure amount, for example, is inputted. Then, at step 4003, loading or unloading of a wafer 12 onto or from the wafer stage 13, or replacement of a reticle 10 as required is performed. Also, the transmission factor of the light attenuating means 18 may be set so as to provide an illuminance effective to produce a proper exposure amount. Further, at step 4004, final preparation such as alignment or leveling of the wafer 12, for example, is performed.

Subsequently, at step 4005, approach running of the variable stop 8, mask 10 and stage 13 is initiated, for the scan exposure. At step 4006, the reflection mirror 21 is inserted into the light path, and the illuminance control is made so that the illuminance on the substrate 12 reaches a desired illuminance, on the basis of an output of the second illuminance sensor 16. The output of the illuminance sensor 20 at that time is memorized into storing means.

As the approach running region is passed and the approach running is completed, at step 4007, the reflection mirror 21 is extracted out of the light path, and the exposure process starts. During the exposure operation, constant-illuminance control is made so that the output of the illuminance sensor 20 is held at the output as memorized at step 4006. As regards the constant illuminance control, the electric power to be applied to the light source 1 may be controlled, for example. Any other method is usable.

When the exposure is completed at step 4008, then, at step 4009, the variable stop 8, the mask 10 and the stage 13 are decelerated. Then, at step 4010, whether the wafer should be replaced or not is discriminated. Namely, if the exposure of the wafer 12 currently placed on the wafer stage 13 is completed, the sequence goes back to step 4003, and the wafer 12 is replaced by another. If the exposure of the current wafer 12 is not completed, the sequence goes back to step 4005, and exposure of the next shot is performed.

Figure 8:
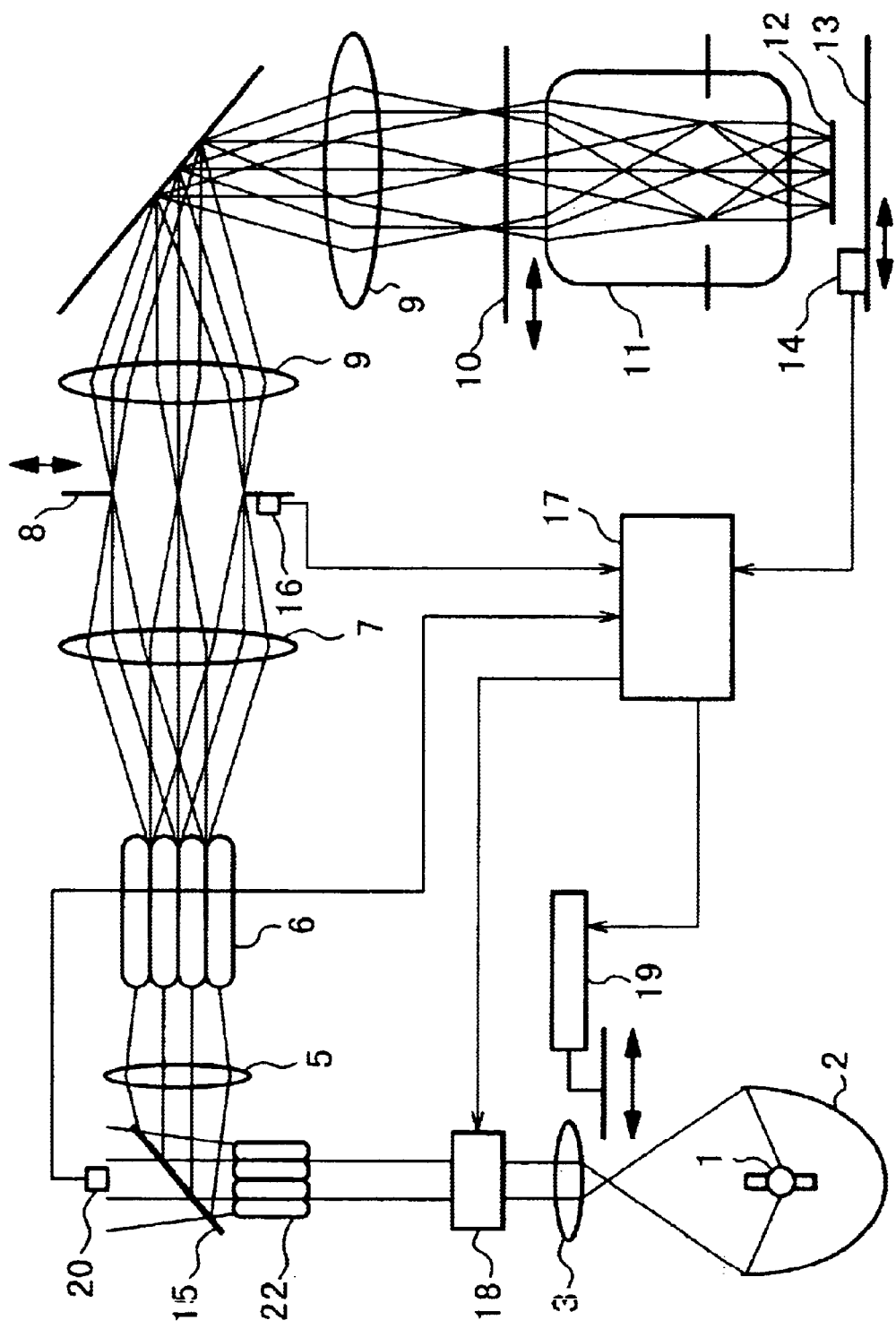
FIG. 8 is a schematic view of an exposure apparatus according to a third embodiment of the present invention, having two fly's eye lenses.
Figure 9:
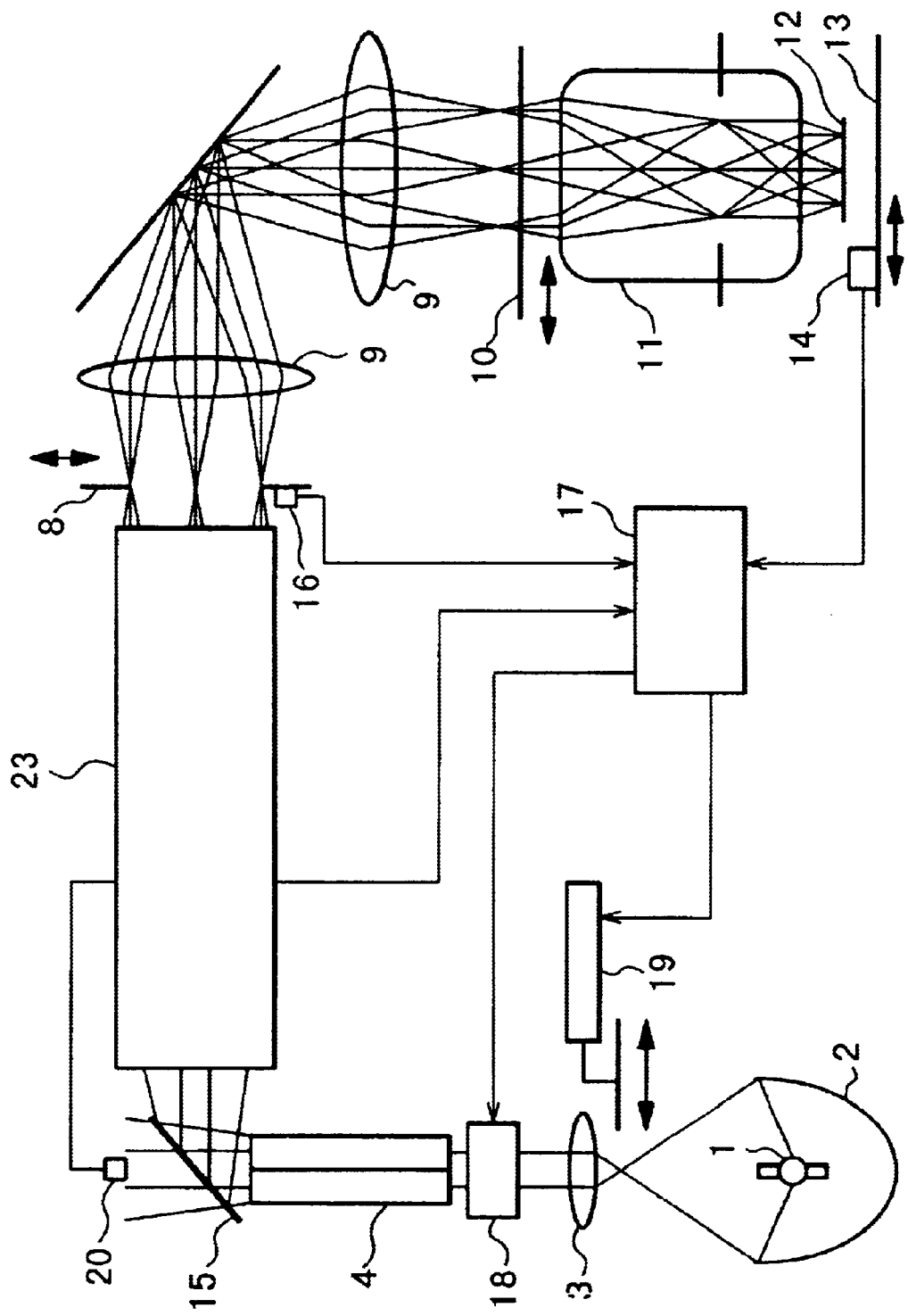
FIG. 9 is a schematic view of an exposure apparatus according to a fourth embodiment of the present invention, using two internal reflection members.
Figure 10:
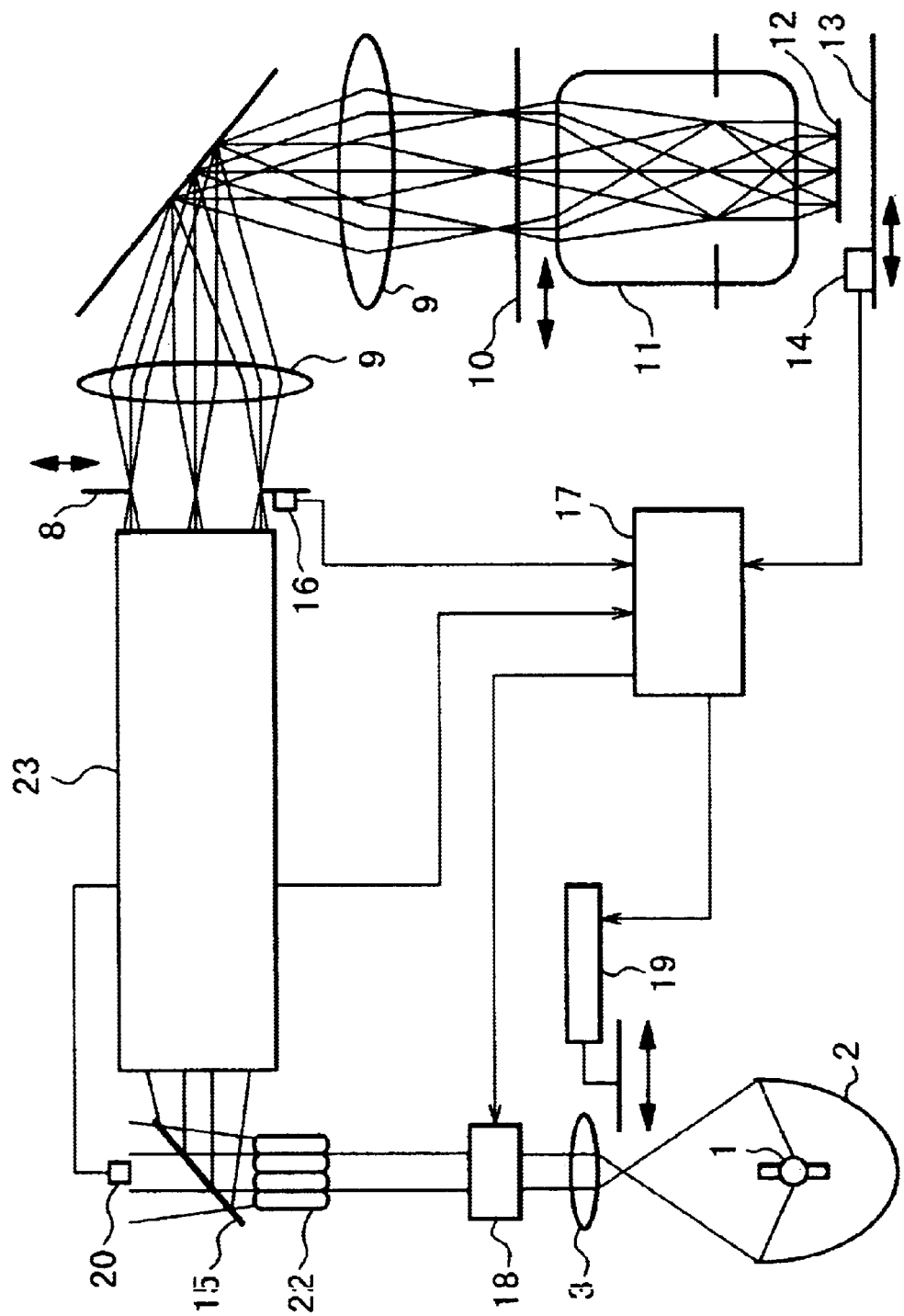
FIG. 10 is a schematic view of an exposure apparatus according to a fifth embodiment of the present invention, using an internal reflection member and a fly's eye lens.
Figure 11:
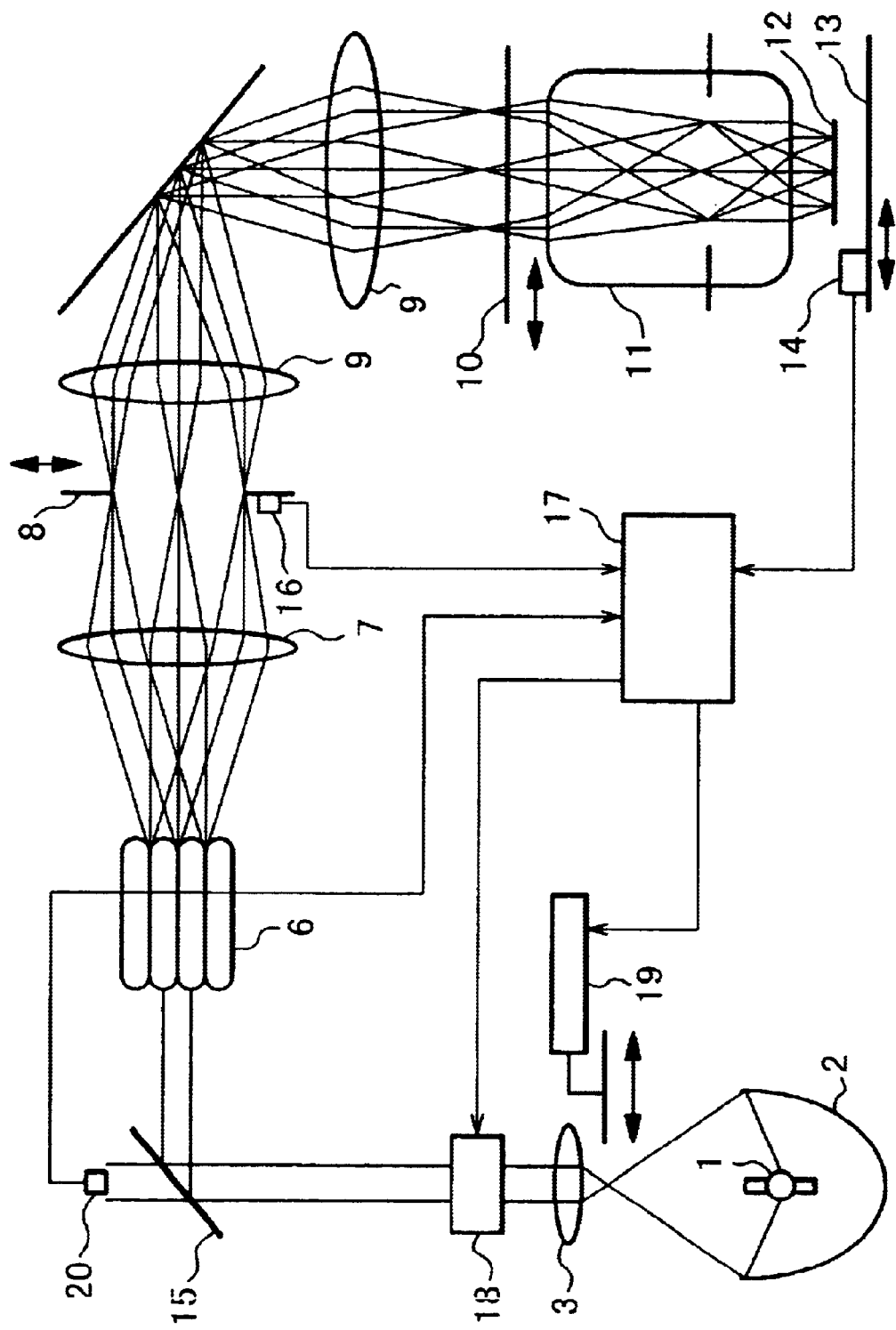
FIG. 11 is a schematic view of an exposure apparatus according to a sixth embodiment of the present invention, using an internal reflection member and a fly's eye lens.

Although this embodiment concerns a projection exposure apparatus having an internal reflection member 4 and a fly's eye lens 6, the present invention is not limited to it. In place of the internal reflection member 4 and the fly's eye lens 6, an optical system including fly's eye lenses 6 and 22 such as shown in FIG. 8, or an optical system including internal reflection members 4 and 23 such as shown in FIG. 9, an optical system including a fly's eye lens 22 and an internal reflection member 23 such as shown in FIG. 10, or an optical system including a single fly's eye lens 6 is usable in this embodiment. Further, the present invention is applicable to a structure wherein an optical fiber bundle or a diffusion plate is used as the light uniforming optical system. In these cases, the first illuminance sensor 20 may be disposed at the light source side of a light uniforming optical system (an optical system having a light uniforming effect such as a fly's eye lens or an internal reflection member, for example) which is disposed closest to the mask 10, and the second illumination sensor 16 may be arranged to perform the illuminance measurement at a position which is closer to the illumination region, than the light uniforming optical system closest to the mask, and which is approximately conjugate with the illumination region.

Figure 12:
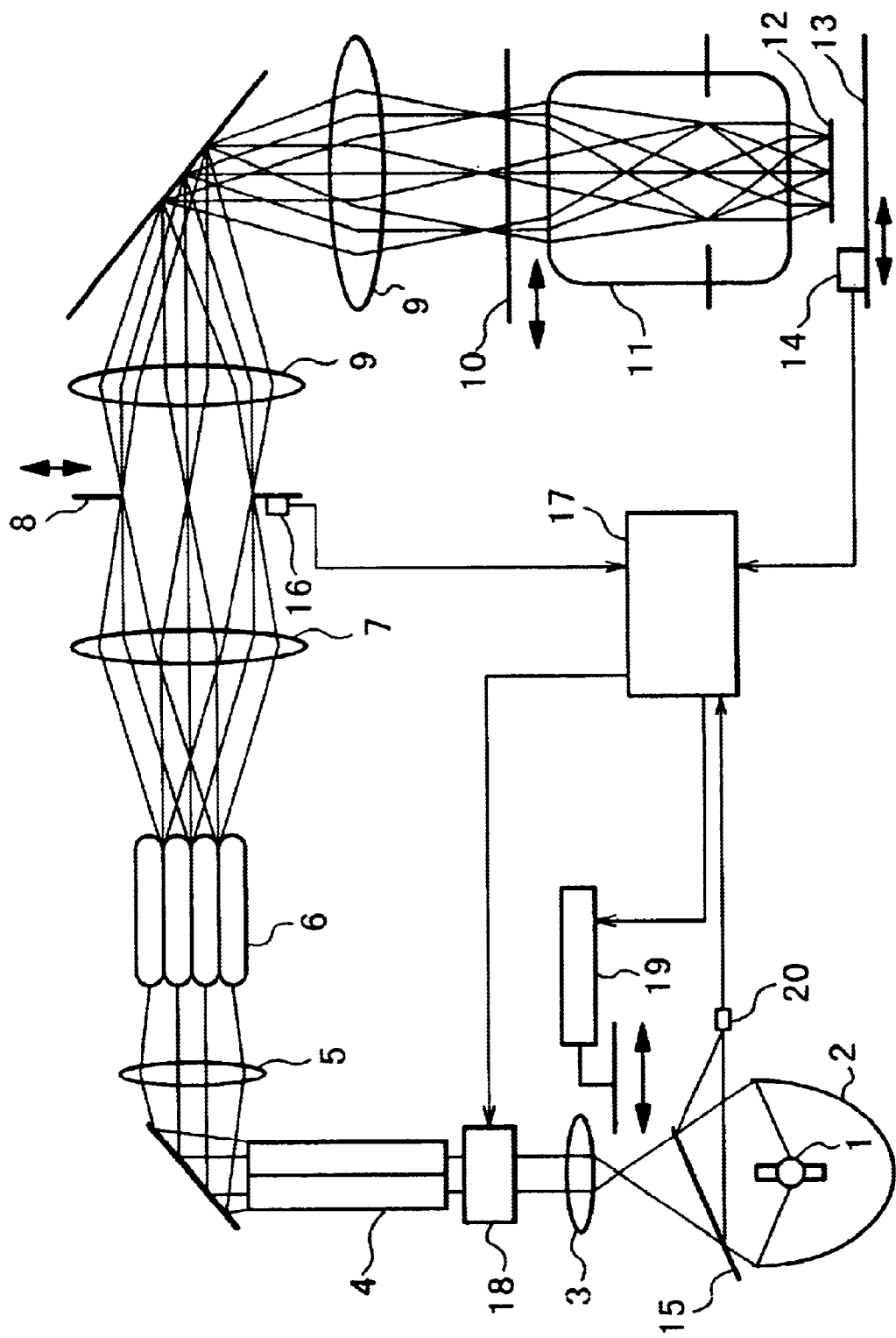
FIG. 12 is a schematic view of an exposure apparatus according to a seventh embodiment of the present invention, in which the position of a first sensor differs from that of the first embodiment.

The first illuminance sensor 20 may be placed at the light source side of the light uniforming optical system (e.g., fly's eye lens or internal reflection member) which is closest to the mask 10. Therefore, in the structure of FIG. 1, the half mirror 15 may be disposed between the condensing mirror 2 and the shutter 19, and the illuminance sensor 20 may be disposed at the light source 1 side of the internal reflection member 4, such as shown in FIG. 12. Further, the structures of the fly's eye lenses 6 and 22 (FIG. 8), the internal reflection members 4 and 23 (FIG. 9), the fly's eye lens 22 and the internal reflection member 23 (FIG. 10), similarly, the half mirror 15 and the illuminance sensor 20 may be disposed at the light source 1 side of the light uniforming optical system closest to the light source 1.

Figure 13:
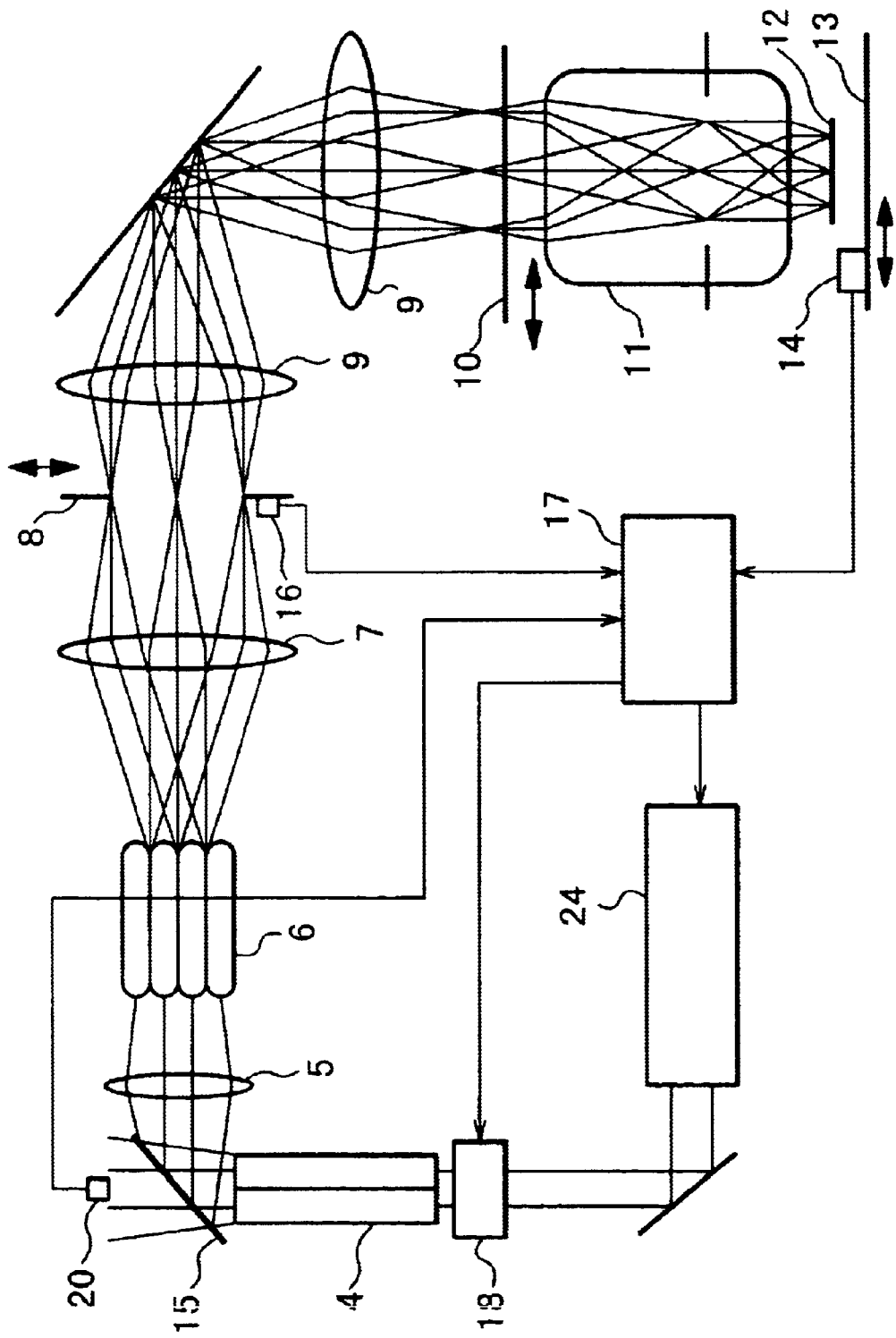
FIG. 13 is a schematic view of an exposure apparatus according to an eighth embodiment of the present invention, using a laser as a light source.

FIG. 13 shows an embodiment of a scan type projection exposure apparatus in which a laser 24 is used in place of the light source 1. Except for use of a laser as a light source, this embodiment is essentially the same as the first embodiment. The constant illuminance control may be made by changing an input voltage to the laser, by controlling the pulse spacing of the laser to keep the illuminance per unit time constant.

Next, an embodiment of a semiconductor device manufacturing method which uses an exposure apparatus such as described above will be explained.

Figure 14:
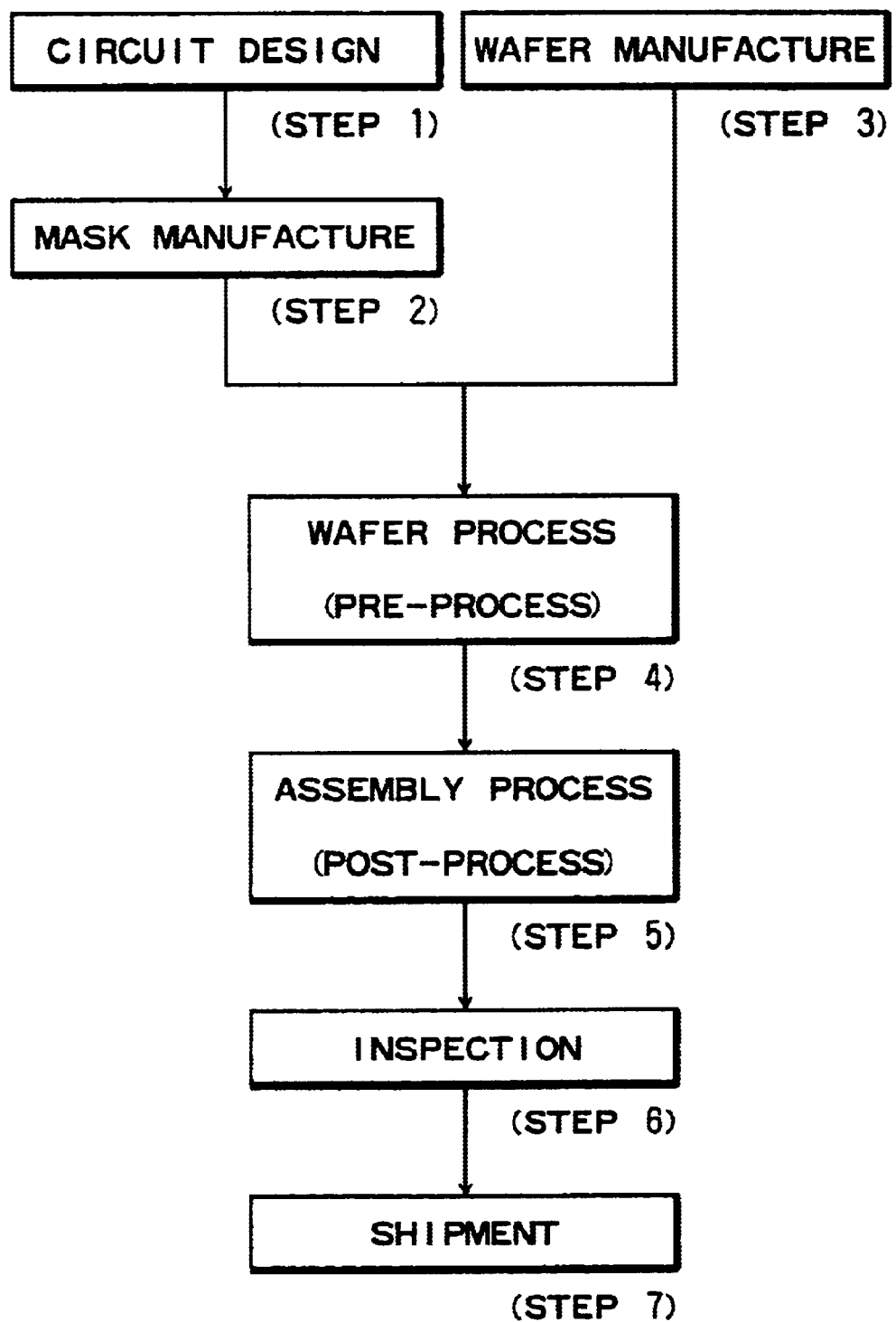
FIG. 14 is a flow chart of a device manufacturing method, to which an exposure apparatus according to the present invention is applicable.

FIG. 14 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 15:
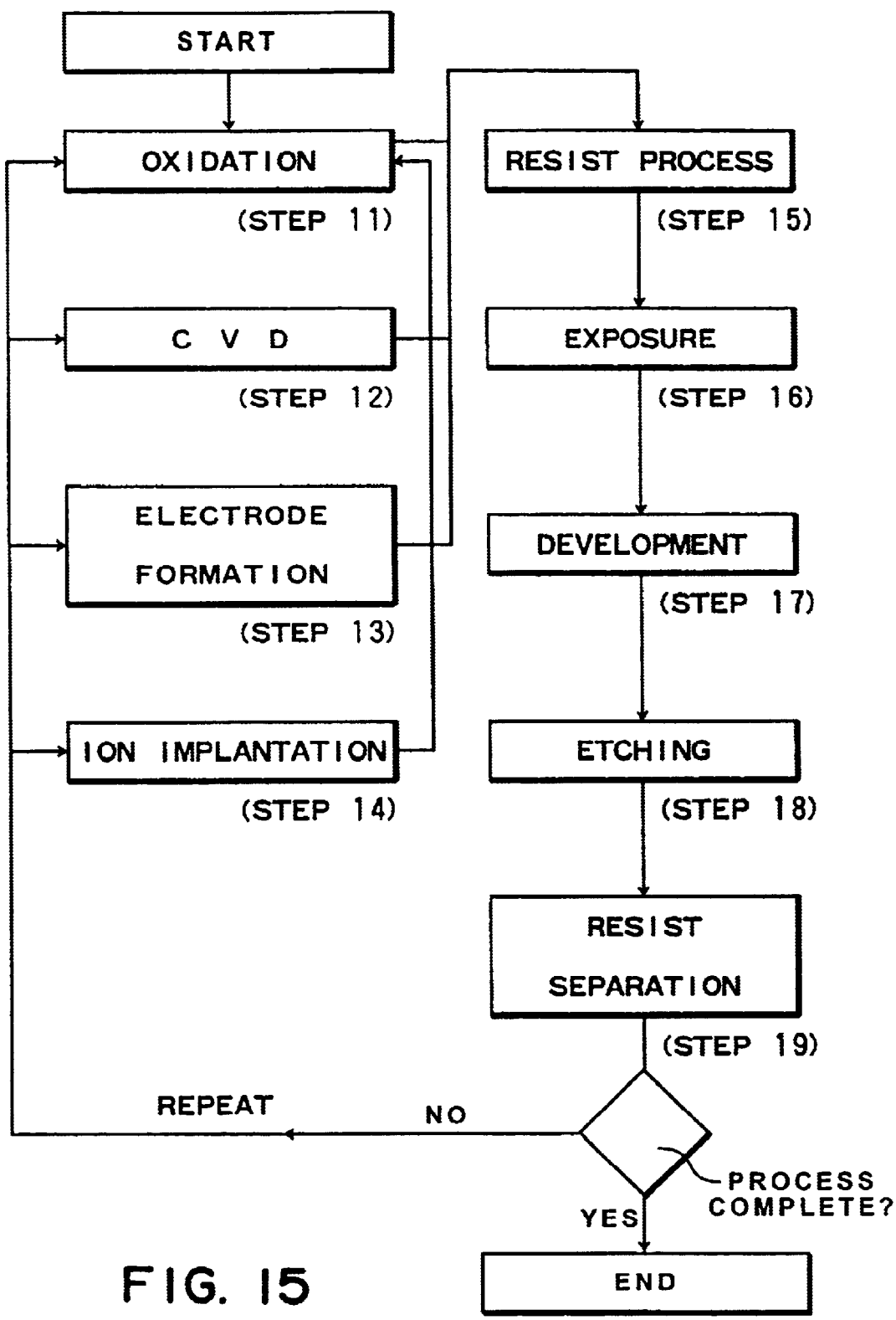
FIG. 15 is a flow chart for explaining details of a wafer process in the procedure of FIG. 14.

FIG. 15 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

As described hereinbefore, the exposure amount control may be made on the basis of an illuminance of light, branched from exposure light in a portion at the light source side of a light intensity uniforming optical system which is, among plural light intensity uniforming optical systems, closest to an object. This avoids design limitation conditions for a half mirror for dividing light, and effectively reduces the space necessary for the exposure amount control. Further, it does not need a half mirror between the original and the light uniforming optical system closest to the original, in the exposure operation. This prevents production of illuminance non-uniformness attributable to a difference in transmission factor, due to the polarization. Also, the measurement precision can be assured by calibration, based on the illuminance measurement at the position being conjugate with the substrate. Further, when the second illuminance measuring means is moved along the light path of exposure light to measure the illuminance, or when a total reflection mirror is used as a reflection mirror to be inserted into the light path of exposure light, for defining a position approximately conjugate with the substrate, even if the state of polarization of the light source changes with time, the ratio between the quantity of light reaching the substrate as well as the quantity of light impinging on the second illuminance measuring means is unchanged. Therefore, the first memorizing step may be made just before the exposure of respective exposure regions on the substrate, so that only a change in the state of polarization of the light source, in a short time period in which one exposure region is exposed, can have an influence to the precision of the exposure amount control. Thus, the exposure amount control precision can be improved significantly.

Further, the illuminance of light branched from the exposure light at the light source side of one of the light uniforming optical systems, which is closest to the original, may be measured by use of the first illuminance measuring means, and the illuminance is controlled on the basis of the measured output so that, during exposure of the substrate, a constant illuminance is held at the exposure region. With this arrangement, although the structure is such that the illuminance is detected on the light path branched before the illuminance uniforming means, accurate exposure amount control can be accomplished consequently.

While the invention has been described with reference to the structures disclosed herein, it is not confined to the details set forth and this application is intended to cover such modifications or changes as may come within the purposes of the improvements or the scope of the following claims.

What is claimed is:

1. An exposure amount control method, comprising the steps of:

illuminating an original with exposure light, emitted from a light source, through a light intensity uniforming optical system having at least one fly's eye lens and/or at least one internal reflection member, so that a pattern of the original illuminated is projected onto and printed on a substrate;

measuring, by use of a first illuminance sensor, an illuminance of the exposure light at a light source side of the or one of said at least one fly's eye lens and/or said at least one internal reflection member, which is closest to the original;

controlling an exposure amount of the substrate on the basis of a measurement output of the first illuminance sensor;

measuring, by use of a second illuminance sensor, an illuminance at a position substantially conjugate with the substrate; and calibrating an output of the first illuminance sensor on the basis of a measurement output of the second illuminance sensor.

2. A method according to claim 1, wherein said calibrating step includes a first memorizing step for storing an output of the first illuminance sensor as the illuminance on the substrate reaches a predetermined value, on the basis of a measurement output produced when the illuminance is measured by the second illuminance sensor, wherein, in said exposure amount controlling step, the exposure amount is controlled so that the output of the first illuminance sensor is registered with the output as stored in said first memorizing step.

3. A method according to claim 2, wherein said first memorizing step is performed at a predetermined timing in a non-exposure period of the substrate and by inserting the second illuminance sensor into a light path of the exposure light, and wherein the second illuminance sensor is moved out of the light path of the exposure light during an exposure period of the substrate.

4. A method according to claim 2, wherein, in an exposure process of the substrate, a portion of the pattern of the original is illuminated with illumination light so that the pattern is projected onto the substrate, while the original and the substrate are scanned in synchronism with each other, by which the pattern of the original is sequentially transferred to the substrate, and wherein the second illuminance sensor is disposed on a variable stop placed at a position substantially conjugate with the substrate.

5. A method according to claim 4, wherein said first memorizing step is carried out in a state in which, for control of an illumination region in accordance with a pattern transfer region of the original, the variable stop blocks at least a portion of the illumination light.

6. A method according to claim 2, wherein said first memorizing step is carried out while defining a position, substantially conjugate with the substrate, on a light path branched by inserting a reflection mirror into the light path of the exposure light at a predetermined timing in a non-exposure period of the substrate, and wherein the reflection mirror is moved out of the light path of the exposure light during an exposure period of the substrate.

7. A method according to claim 2, wherein said first memorizing step is carried out just before an exposure of each exposure region of the substrate.

8. A method according to claim 1, wherein the second illuminance sensor measures the illuminance of the exposure light at a substrate side of the or one of the light intensity uniforming optical systems which is closest to the original.

9. An exposure amount control method, comprising the steps of:

illuminating an original with exposure light, emitted from a light source, through one or more light intensity uniforming optical systems, so that a pattern of the original illuminated is projected onto and printed on a substrate;

measuring, by use of a first illuminance sensor, an illuminance of the exposure light as branched at a light source side of the or one of the light intensity uniforming optical systems which is closest to the original;

controlling an exposure amount of the substrate on the basis of a measurement output of the first illuminance sensor;

measuring, by use of a second illuminance sensor, an illuminance at a position substantially conjugate with the substrate; and calibrating an output of the first illuminance sensor on the basis of a measurement output of the second illuminance sensor, wherein said calibrating step includes a first memorizing step for storing an output of the first illuminance sensor as the illuminance on the substrate reaches a predetermined value, on the basis of a measurement output produced when the illuminance is measured by the second illuminance sensor, wherein, in said exposure amount controlling step, the exposure amount is controlled so that the output of the first illuminance sensor is registered with the output as stored in said first memorizing step; and further comprising a second memorizing step for measuring, by use of a third illuminance sensor, an illuminance at a predetermined timing and at a position substantially equivalent to the substrate, and for performing measurement by use of the second illuminance sensor, and then for storing a relation of illuminances between the second and third illuminance sensor positions as obtained from the result of the measurements.

10. A method according to claim 9, wherein a relation T1<T2 is satisfied where T1 and T2 are intervals of the first and second memorizing steps, respectively.

11. An exposure apparatus, comprising:

exposure means for exposing a substrate; and a control unit for controlling an exposure amount of the substrate in accordance with the exposure amount control method as recited in claim 9.

12. A device manufacturing method, comprising the steps of:

exposing a substrate while controlling an exposure amount of the substrate in accordance with the exposure method as recited in claim 9; and developing the exposed substrate.

13. A device manufacturing method, comprising the steps of:

illuminating an original with exposure light, emitted from a light source, through a light intensity uniforming optical system having at least one fly's eye lens and/or at least one internal reflection member, so that a pattern of the original illuminated is projected onto and printed on a photosensitive substrate;

measuring, by use of a first illuminance sensor, an illuminance of the exposure light at a light source side of the or one of said at least one fly's eye lens and/or said at least one internal reflection member, which is closest to the original;

controlling an exposure amount of the substrate on the basis of a measurement output of the first illuminance sensor;

measuring, by use of a second illuminance sensor, an illuminance at a position substantially conjugate with the substrate;

calibrating an output of the first illuminance sensor on the basis of a measurement output of the second illuminance sensor; and developing the exposed substrate, whereby a circuit is formed on the developed substrate.

14. A method according to claim 13, wherein the second illuminance sensor measures the illuminance of the exposure light at a substrate side of the or one of the light intensity uniforming optical systems which is closest to the original.

15. An exposure apparatus, comprising:

an illumination optical system for illuminating an original with exposure light emitted from a light source, said illumination optical system including a light intensity uniforming optical system having at least one fly's eye lens and/or at least one internal reflection member for making uniform the exposure light;

a projection optical system for projecting a pattern of the original illuminated with the exposure light, onto a substrate;

a first illuminance sensor for measuring an illuminance of the exposure light at a light source side of the or one of said at least one fly's eye lens and/or said at least one internal reflection member, which is closest to the original;

a control unit for controlling an exposure amount of the substrate on the basis of a measurement output of said first illuminance sensor; and a second illuminance sensor for measuring an illuminance at a position substantially conjugate with the substrate, wherein said control unit is operable to calibrate an output of said first illuminance sensor on the basis of a measurement output of said second illuminance sensor.

16. An apparatus according to claim 15, further comprising a scan mechanism for scanning the original and the substrate in synchronism with each other, in the projection with said projection optical system.

17. An apparatus according to claim 15, wherein said second illuminance sensor measures the illuminance of the exposure light at a substrate side of the or one of the light intensity uniforming optical systems which is closest to the original.

18. An apparatus according to claim 15, wherein said light intensity uniforming optical system includes a first fly's eye lens and a second fly's eye lens in an order from the light source side, and wherein said first illumination sensor is disposed at the light source side of said second fly's eye lens.

19. An apparatus according to claim 15, wherein said light intensity uniforming optical system includes a fly's eye lens and an internal reflection member in an order from the light source side, and wherein said first illumination sensor is disposed at the light source side of said internal reflection member.

20. An apparatus according to claim 15, wherein said light intensity uniforming optical system includes a first internal reflection member and a second internal reflection member in an order from the light source side, and wherein said first illumination sensor is disposed at the light source side of said second internal reflection member.

21. An apparatus according to claim 15, wherein said light intensity uniforming optical system includes a fly's eye lens, and wherein said first illumination sensor is disposed at the light source side of said one fly's eye lens.

22. An exposure amount control method, comprising the steps of:

illuminating an original with exposure light, emitted form a light source, through a light intensity uniforming optical system having at least one fly's eye lens and/or at least one internal reflection member, so that a pattern of the original illuminated is projected onto and printed on a substrate;

measuring, by use of a first illuminance sensor, an illuminance of the exposure light at a light source side of the or one of said at least one fly's eye lens and/or said at least one internal reflection member, which is closest to the original; and controlling an exposure amount of the substrate on the basis of a measurement output of the first illuminance sensor, so that the illuminance in the exposed region is kept constant during the exposure of the substrate.

23. A method according to claim 22, further comprising measuring, by use of a second illuminance sensor, an illuminance at a position substantially conjugate with the substrate, and calibrating an output of the first illuminance sensor on the basis of a measurement output of the second illuminance sensor.

24. A method according to claim 22, wherein the second illuminance sensor measures the illuminance of the exposure light at a substrate side of the or one of the light intensity uniforming optical systems which is closest to the original.

25. A device manufacturing method, comprising the steps of:

illuminating an original with exposure light, emitted from a light source, through a light intensity unforming optical system having at least one fly's eye lens and/or at least one internal reflection member, so that a pattern of the original illuminated is projected onto and printed on a photosensitive substrate;

measuring, by use of a first illuminance sensor, an illuminance of the exposure light at a light source side of the or one of said at least one fly's eye lens and/or said at least one internal reflection member, which is closest to the original; and controlling an exposure amount of the substrate on the basis of a measurement output of the first illuminance sensor, so that the illuminance in the exposed region is kept constant during the exposure of the substrate.

26. A method according to claim 25, further comprising measuring, by use of a second illuminance sensor, an illuminance at a position substantially conjugate with the substrate, and calibrating an output of the first illuminance sensor on the basis of a measurement output of the second illuminance sensor.

27. A method according to claim 25, wherein the second illuminance sensor measures the illuminance of the exposure light at a substrate side of the or one of the light intensity uniforming optical systems which is closest to the original.

28. An exposure apparatus, comprising:

an illumination optical system for illuminating an original with exposure light emitted from a light source, said illumination optical system including a light intensity uniforming optical system having at least one fly's eye lens and/or at least one internal reflection member for making uniform the exposure light;

a projection optical system for projecting a pattern of the original illuminated with the exposure light, onto a substrate;

a first illuminance sensor for measuring an illuminance of the exposure light at a light source side of the or one of said at least one fly's eye lens and/or said at least one internal reflection member, which is closest to the original; and a control unit for controlling an exposure amount of the substrate on the basis of a measurement output of said first illumination sensor, so that the illuminance at the exposed region is kept constant during the exposure of the substrate.

29. An apparatus according to claim 28, further comprising a second illuminance sensor for measuring an illuminance at a position substantially conjugate with the substrate, wherein said control unit is operable to calibrate an output of said first illuminance sensor on the basis of a measurement output of said second illuminance sensor.

30. An apparatus according to claim 29, further comprising a scan mechanism for scanning the original and the substrate in synchronism with each other, in the projection with said projection optical system.

31. An apparatus according to claim 28, further comprising a second illuminance sensor, which measures the illuminance of the exposure light at a substrate side of the or one of the light intensity uniforming optical systems which is closest to the original.

32. An apparatus according to claim 28, wherein said light intensity uniforming optical system includes a first fly's eye lens and a second fly's eye lens in an order from the light source side, and wherein said first illumination sensor is disposed at the light source side of said second fly's eye lens.

33. An apparatus according to claim 28, wherein said light intensity uniforming optical system includes a fly's eye lens and an internal reflection member in an order from the light source side, and wherein said first illumination sensor is disposed at the light source side of said internal reflection member.

34. An apparatus according to claim 28, wherein said light intensity uniforming optical system includes a first internal reflection member and a second internal reflection member in an order from the light source side, and wherein said first illumination sensor is disposed at the light source side of said second internal reflection member.

35. An apparatus according to claim 28, wherein said light intensity uniforming optical system includes one fly's eye lens, and wherein said first illumination sensor is disposed at the light source side of said one fly's eye lens.

36. A method of controlling an exposure amount, comprising the steps of:

illuminating an original with exposure light, emitted from a light source, through a light intensity uniforming optical system having at least one fly's eye lens and/or at least one internal reflection member, so that a pattern of the original illuminated is projected onto a substrate;

measuring an illuminance of the exposure light by use of a first illuminance sensor, at between (i) a light entrance surface of the or one of said at least one fly's eye lens and/or said at least one internal reflection member, which is closest to the light source side, and (ii) a light exit surface of the or one of said at least one fly's eye lens and/or said at least one internal reflection member, which is closest to the original; and controlling an exposure amount of the substrate on the basis of a measurement output of said first illuminance sensor.

37. A device manufacturing method, comprising the steps of:

illuminating an original with exposure light, emitted from a light source, through a light intensity uniforming optical system having at least one fly's eye lens and/or at least one internal reflection member, so that a pattern of the original illuminated is projected onto a substrate;

measuring an illuminance of the exposure light by use of a first illuminance sensor, at between (i) a light entrance surface of the or one of said at least one fly's eye lens and/or said at least one internal reflection member, which is closest to the light source side, and (ii) a light exit surface of the or one of said at least one fly's eye lens and/or said at least one internal reflection member, which is closest to the original;

controlling an exposure amount of the substrate on the basis of a measurement output of said first illuminance sensor; and developing the exposed substrate.

38. An exposure apparatus, comprising:

an illumination optical system for illuminating an original with exposure light emitted from a light source, said illumination optical system including a light intensity uniforming optical system for making the exposure light substantially uniform, said light intensity uniforming optical system having at least one fly's eye lens and/or at least one internal reflection member;

a projection optical system for projecting a pattern of the original illuminated with the exposure light, onto a substrate;

a first illuminance sensor for measuring an illuminance of the exposure light at between (i) a light entrance surface of the or one of said at least one fly's eye lens and/or said at least one internal reflection member, which is closest to the light source side, and (ii) a light exit surface of the or one of said at least one fly's eye lens and/or said at least one internal reflection member, which is closest to the original;

a relay optical system disposed between (i) an entrance surface of one of said at least one fly's eye lens and/or at least one internal reflection member, which is closest to the light source side, and (ii) an exit surface of one of said at least one fly's eye lens and/or at least one internal reflection member, which is closest to the original; and a control unit for controlling an exposure amount of the substrate on the basis of a measurement output of said first illuminance sensor.

39. An apparatus according to claim 38, wherein said light intensity uniforming optical system includes a first fly's eye lens and a second fly's eye lens in an order from the light source side, and wherein said first illumination sensor is disposed at the light source side of said fly's eye lens.

40. An apparatus according to claim 38, wherein said light intensity uniforming optical system includes a fly's eye lens and an internal reflection member in an order from the light source side, and wherein said first illumination sensor is disposed at the light source side of said internal reflection member.

41. An apparatus according to claim 38, wherein said light intensity uniforming optical system includes a first internal reflection member and a second internal reflection member in an order from the light source side, and wherein said first illumination sensor is disposed at the light source side of said second internal reflection member.

42. An apparatus according to claim 38, wherein said light intensity uniforming optical system includes one fly's eye lens, and wherein said first illumination sensor is disposed at the light source side of said one fly's eye lens.

43. An apparatus according to claim 38, wherein said first illuminance sensor is disposed at a position not being conjugate with the substrate.

44. A device manufacturing method, comprising the steps of:

exposing a substrate by use of an exposure apparatus as recited in claim 38; and developing the exposure substrate.

* * * * *